(12) United States Patent
Bhattacharya

(10) Patent No.: US 9,236,511 B2
(45) Date of Patent: Jan. 12, 2016

(54) FABRICATION OF IONIC LIQUID ELECTRODEPOSITED CU—SN—ZN—S—SE THIN FILMS AND METHOD OF MAKING

(71) Applicant: Alliance for Sustainable Energy, LLC, Golden, CO (US)

(72) Inventor: Raghu Nath Bhattacharya, Littleton, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 14/323,651

(22) Filed: Jul. 3, 2014

(65) Prior Publication Data

US 2014/0322859 A1    Oct. 30, 2014

Related U.S. Application Data

(62) Division of application No. 13/731,841, filed on Dec. 31, 2012, now abandoned.

(60) Provisional application No. 61/581,962, filed on Dec. 30, 2011.

(51) Int. Cl.
*H01L 21/00*       (2006.01)
*H01L 21/302*      (2006.01)
*H01L 21/461*      (2006.01)
(Continued)

(52) U.S. Cl.
CPC .......... *H01L 31/03923* (2013.01); *C25D 3/665* (2013.01); *C25D 5/10* (2013.01); *C25D 5/50* (2013.01); *C25D 7/12* (2013.01); *H01L 21/02422* (2013.01); *H01L 21/02491* (2013.01); *H01L 21/02551* (2013.01); *H01L 21/02568* (2013.01); *H01L 21/02614* (2013.01); *H01L 21/02628* (2013.01); *H01L 31/0326* (2013.01); *H01L 31/03925* (2013.01); *H01L 31/072* (2013.01); *C25D 3/22* (2013.01); *C25D 3/30* (2013.01); *C25D 3/38* (2013.01); *Y02E 10/50* (2013.01)

(58) Field of Classification Search
CPC .................. H01L 31/03925; H01L 21/02568; H01L 21/02628; H01L 21/02491; H01L 21/02614; H01L 21/02551; H01L 31/0326
USPC .................... 438/95, 752; 257/613, E31.026; 136/264, 265; 205/147, 177
See application file for complete search history.

(56) References Cited

U.S. PATENT DOCUMENTS 7,183,433 B2 *  2/2007  Abbott et al. .................. 564/282
8,071,779 B2 * 12/2011  Lampe et al. .................. 546/199
(Continued)

OTHER PUBLICATIONS

Ahmed et al., "A High Efficiency Electrodeposited Cu2ZnSnS4 Solar Cell", Advanced Energy Materials, 2012, vol. 2, pp. 253-259.
(Continued)

*Primary Examiner* — A. Sefer
*Assistant Examiner* — Dilinh Nguyen
(74) *Attorney, Agent, or Firm* — Michael A. McIntyre

(57) ABSTRACT

A semiconductor thin-film and method for producing a semiconductor thin-films comprising a metallic salt, an ionic compound in a non-aqueous solution mixed with a solvent and processing the stacked layer in chalcogen that results in a CZTS/CZTSS thin films that may be deposited on a substrate is disclosed.

17 Claims, 5 Drawing Sheets

(51) Int. Cl.
*H01L 29/12* (2006.01)
*H01L 31/0256* (2006.01)
*H01L 31/0392* (2006.01)
*H01L 31/032* (2006.01)
*C25D 7/12* (2006.01)
*C25D 3/66* (2006.01)
*C25D 5/10* (2006.01)
*C25D 5/50* (2006.01)
*H01L 31/072* (2012.01)
*H01L 21/02* (2006.01)
*C25D 3/22* (2006.01)
*C25D 3/30* (2006.01)
*C25D 3/38* (2006.01)

(56) References Cited

U.S. PATENT DOCUMENTS

2009/0118558 A1* 5/2009 Atkins et al. ............ 585/639
2009/0194426 A1* 8/2009 Abbott ..................... 205/234
2009/0205714 A1* 8/2009 Kuhnlein et al. ......... 136/264
2011/0132462 A1 6/2011 Free et al.
2013/0168825 A1 7/2013 Bhattacharya

OTHER PUBLICATIONS

Chan et al., "Preparation of Cu2ZnSnS4 films by electrodeposition using ionic liquids", Solar Energy Materials & Solar Cells, 2010, vol. 94, pp. 207-211.

Chen et al., "Preparing Cu2ZnSnS4 films using the co-electro-deposition method with ionic liquids", Chinese Phys. B, 2012, vol. 21, pp. 058801-1-058801-4.

Cui et al., "Synthesis and characterization of co-electroplated Cu2ZnSnS4 thin films as potential photovoltaic material", Solar Energy Materials & Solar Cells, 2011, vol. 95, pp. 2136-2140.

Jeon et al., "Cu2ZnSnSe4 thin films and nanowires prepared by different single-step electrodeposition method in quaternary electrolyte", Materials Letters, 2011, vol. 65, pp. 2364-2367.

Katagiri et al., "The influence of the composition ratio on CZTS-based thin film solar cells", Materials Research Society Symposium Proceedings, 2009, vol. 1165, pp. 2-12.

Li et al., "Preparation and characterization of Cu2ZnSnSe4 thin films by selenization of electrodeposited metal precursors", Materials Science Forum, Jun. 7, 2011, vol. 685, pp. 105-109.

Mitzi et al., "The path towards a high-performance solution-processed kesterite solar cell", Solar Energy Materials & Solar Cells, 2011, vol. 95, pp. 1421-1436.

Pawar et al., "Single step electrosynthesis of Cu2ZnSnS4 (CZTS) thin films for solar cell application", Electrochimica Acta, 2010, vol. 55, pp. 4057-4061.

Pawar et al., "Effect of Annealing Atmosphere on the Properties of Electrochemically Deposited Cu2ZnSnS4 (CZTS) Thin Films", International Scholarly Research Network, ISRN Renewable Energy, vol. 2011, Article ID 934575, pp. 1-5.

Sarswat et al., "CZTS thin films on transparent conducting electrodes by electrochemical technique", Thin Solid Films, Jul. 21, 2011, pp. 1-22.

Schubert et al., "Cu2ZnSnS4 thin film solar cells by fast coevaporation", Progress in Photovoltaics: Research and Applications, 2011, vol. 19, pp. 93-96.

Scragg et al., "A 3.2% efficient Kesterite device from electrodeposited stacked elemental layers", Journal of Electroanalytical Chemistry, 2010, vol. 646, pp. 52-59.

Scragg, "Studies of Cu2ZnSnS4 films prepared by sulfurisation of electrodeposited precursors", A thesis submitted for the degree of Doctor of Philosophy, University of Bath, Department of Chemistry, May 2010, pp. 1-262.

Todorov et al., "High-efficiency Solar Cell with Earth-Abundant Liquid-Processed Absorber", Advanced Energy Materials, 2010, vol. 22, pp. E156-E159.

Wang et al., "Thin film solar cells based on Cu2ZnSnS4 absorber", The 5th World Congress on Engineering Asset Management (WCEAM 2010), Oct. 25-27, Brisbane, Queensland, pp. 1-8.

* cited by examiner

FABRICATION OF IONIC LIQUID ELECTRODEPOSITED CU—SN—ZN—S—SE THIN FILMS AND METHOD OF MAKING

CROSS REFERENCE TO RELATED APPLICATIONS

The present application is a divisional of U.S. application Ser. No. 13/731,841, filed Dec. 31, 2012, which claims priority from U.S. Provisional Patent Application No. 61/581,962, filed Dec. 30, 2011, the entire disclosures of which are hereby incorporated herein by reference.

CONTRACTUAL ORIGIN

The United States Government has rights in this invention under Contract No. DE-AC36-08G028308 between the United States Department of Energy and the Alliance for Sustainable Energy, LLC, the Manager and Operator of the National Renewable Energy Laboratory.

BACKGROUND

Photovoltaic (PV) solar electric technology will be a significant contributor to world energy supplies when reliable, efficient PV power products are manufactured in large volumes at low cost. A promising pathway to reducing PV cost is the use of thin-film technologies in which thin layers of photoactive materials are deposited inexpensively on large-area substrates. The primary chalcogenide semiconductor absorber materials currently used for thin-film PV device applications are $Cu(In,Ga)Se_2$ and CdTe. Despite the promise of these technologies, the toxicity of Cd and supply limitations for In and Te are projected to limit the production capacity of these existing chalcogen-based technologies to less than 100 Global Warming Potential (GWP) per year. This represents a small fraction of the world's growing energy needs, which are expected to double to 27 Terrawat by 2050.

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

BRIEF DESCRIPTION OF THE DRAWINGS

Exemplary embodiments are illustrated in referenced figures of the drawings. It is intended that the embodiments and figures disclosed herein are to be considered illustrative rather than limiting.

FIG. 4a illustrates the SEM surface morphology and FIG. 4b illustrates the SEM cross-section of annealed CZTSS thin films.

DETAILED DESCRIPTION

In addition to the exemplary aspects and embodiments described above, further aspects and embodiments will become apparent by reference to the drawings and by study of the following descriptions.

The inventors of the present application realized that combining the use of electrodeposition and ionic liquids in the fabrication of chalcogen-based semiconductor thin films, such has copper, zinc, tin, sulfur and selenium (CZTSS), produced unexpected results that provide alternatives to copper indium gallium diselenide (CIGS). Low-cost, non-vacuum electrodeposition of CZTSSe thin film from aqueous and also ionic liquid electrolytes circumvents the toxicity typically associated with the use of hydrazine. Ionic liquids have wide electrodeposition potential windows and high thermal stability, resulting in higher deposition efficiencies for electronegative species and allowing higher deposition temperatures to promote in-situ crystallization, thereby avoiding the need for post-deposition thermal annealing. This solvent system permits depositing CTZSS that is free of impurities (including oxides and hydroxides). In order to avoid the water reduction, electrodeposition may be performed using non-aqueous solvents with a large electrochemical window like ionic liquids (ILs).

Figure 1:
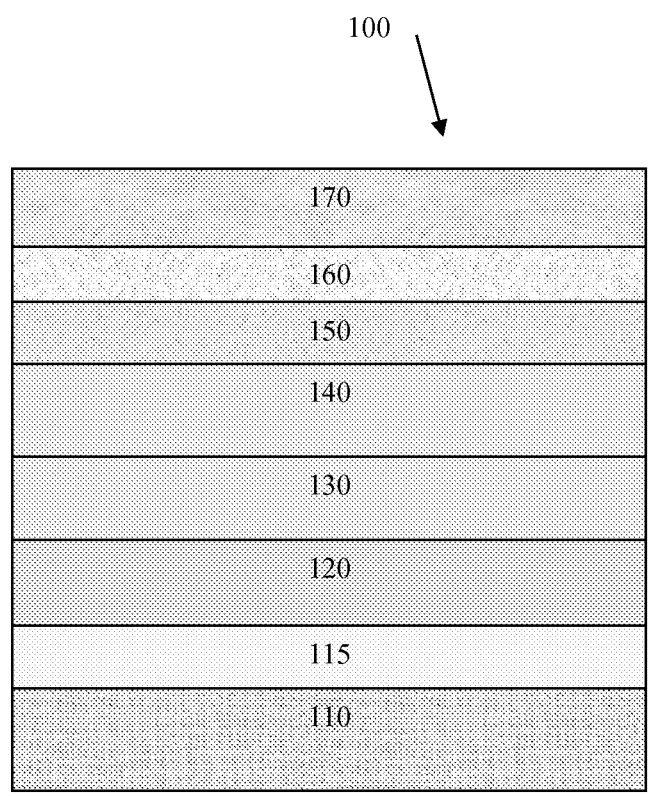
FIG. 1 is a block diagram illustrating one embodiment of a Cu—Zn—Sn—S—Se (CZTSS) semiconductor thin film.

Disclosed herein are metallic salts that may be used in a solution for a semiconductor thin-film. In certain embodiments, the solvent comprises ethylene glycol mixed with the ionic compound, water, HCl or boric acid ($H_3BO_3$). FIG. 1 illustrates an electrochemical structure 100 having a substrate 110, a three-layered thin film comprising a first layer 120 deposited onto the substrate 110, a second layer 130 deposited onto the first layer 120 and a third layer 140 deposited onto the second layer 130. In some embodiments the thin-film that is deposited on a substrate comprises at least one copper salt, tin salt, zinc salt, or any combination thereof. In some embodiments the substrate 110 may comprise glass, chromium, molybdenum, silicon, silicon dioxide, aluminum oxide, sapphire, germanium, an alloy of silicon and germanium, indium phosphide (InP), glass coated with a Molybdenum film 115, or any combination thereof.

Exemplary electrochemical structure 100 may comprise a metallic salt, a chalcogen and an ionic compound in a non-aqueous solution mixed with a solvent within the first layer 120, second layer 130 and third layer 140. In some embodiments the first layer 120 and second layer 130 may comprise a metallic salt. The metallic salt may comprise copper sulfate, stannous chloride ($SnCl_2$), stannic chloride ($SnCl_4$), zinc sulfate, zinc chloride or any combination thereof. In some embodiments, the chalcogen may comprise selenium, sulfur, telluride, polonium and combinations thereof. In other embodiments, the third layer 140 may comprise an ionic compound in a non-aqueous solution mixed with a solvent such as choline chloride-ethylene glycol solution or a sulfonate-based solution. In certain embodiments, the sulfonate-based solution is mixed with a surfactant.

Suitable ionic compounds or supporting electrolyte/complexing ions comprise salts such as sodium sulfate, sodium fluoride, potassium fluoride, potassium bifluoride, sodium bifluoride, sodium chloride, zinc chloride, potassium chloride, or choline chloride ($C_5H_{14}ClNO$). In some embodiments, where the ionic compound comprise sulfonate, it may be mixed with a surfactant. The sulfonate may comprise mesylate, triflate, tosylate, or besylate. Exemplary solvents for dissolving the ionic compounds or supporting electrolyte/complexing ions are provided in the examples, such as water or choline chloride mixed with ethylene glycol, HCl or boric acid, but any solvent that dissolves an ionic compound may be used.

In certain embodiments, the plating current density is in the range of approximately 1 to 8 mA/cm$^2$. The pH of the solution may be in the range of approximately 1-5. This p-type CTZSS semiconductor has optical band gap energy of about 1.2 eV with a tremendous potential for commercial production of low-cost, high-efficiency PV modules. All CTZSS materials (Cu—Sn—Zn—S—Se) are earth abundant and have a cell efficiency of approximately 20%.

Figure 2:
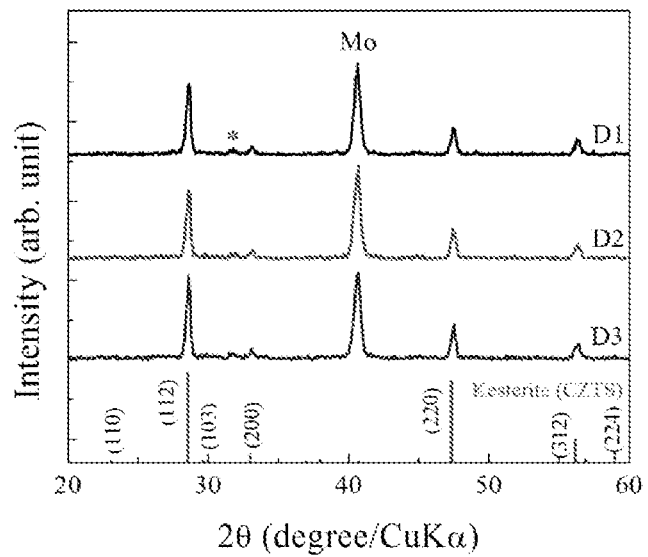
FIG. 2 illustrates X-ray diffraction patterns for several films with varying atomic ratios.

FIG. 2 shows the X-ray diffraction (XRD) patterns of three annealed CZTS thin films (D1, D2 and D3). The precursor electrodeposited Cu/Sn/Zn stacked layers were annealed in a tube furnace at 550° C. in elemental S atmosphere for 60 minutes. All samples were prepared at same condition to check the reproducibility of the deposition conditions. The precursor film compositions of the films, as analyzed by ICP-MS, were Cu:47-49 at %; Zn:27-25 at %, and Sn:26-24 at %. As shown in FIG. 2, the XRD patterns are almost identical for all three samples representing Kesterite CZTS structure [joint committee on powder diffraction standards (JCPDS) #26-0575].

Figure 3:
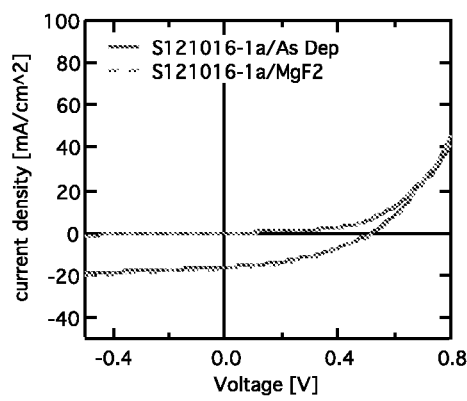
FIG. 3a illustrates dark and light current response curves of an electrodeposited CZTSS device.
FIG. 3b illustrates the external quantum efficiency (EQE) spectrum of the CZTSS device.
Figure 3:
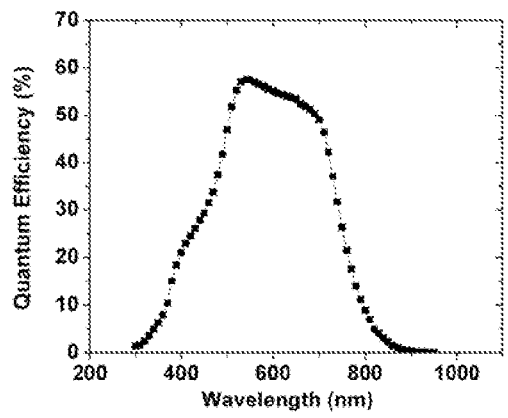

FIGS. 3a and 3b show the device efficiency of 3.6% of an annealed electrodeposited CZTSS film. As shown in FIG. 3a, the dark and light current response curves of an electrodeposited CZTSS device. FIG. 3b shows the external quantum efficiency (EQE) spectrum of a representative CZTSS device. The device efficiency (FIG. 3a) that resulted from the processed electrodeposited precursor film in Se and S atmosphere was 3.6% with a respectable $V_{oc}$ (0.54 V). FIG. 3b displays the external quantum efficiency (EQE) spectrum of a representative device. This EQE spectrum reveals that the optical band gap of the CZTSS thin film is ~1.55 eV (800 nm). To improve the device efficiency, one can optimize the electrodeposition and processing conditions of the stacked layer in Se and S at high temperature.

Figure 4:
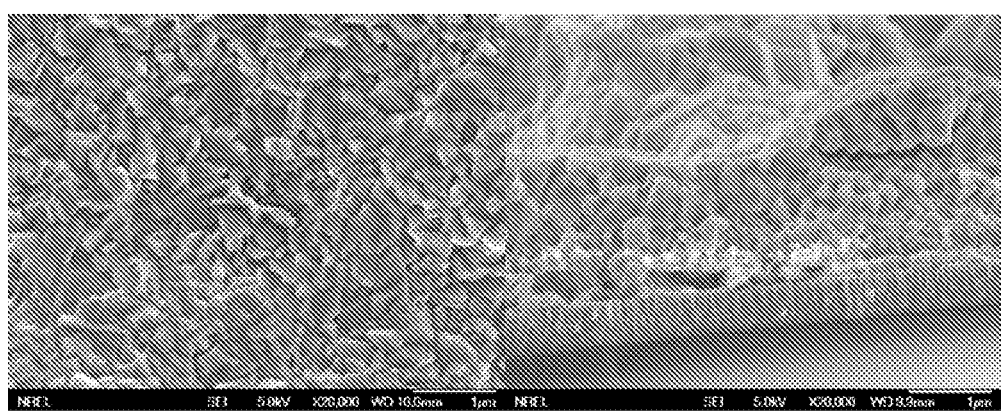
FIG. 4 illustrates the SEM results of the thin films.

The surface morphology and cross-sectional view (SEM) of a representative annealed film is shown in FIGS. 4a and 4b. The SEM as shown in FIG. 4a and FIG. 4b, indicate that films are crack-free and have a compact dense morphology. The cross-sectional view (FIG. 4b) of the film shows the film thickness is about 1.3 μm and it has a very rough surface morphology. The grain size determined from the top-view and cross-sectional images ranged from about 100 to 500 nm, and the grains exhibit sharp facets. This result indicates that we need to further optimize the deposition and processing conditions to obtain smooth and uniform films. Solar cell devices were fabricated from these absorber materials.

All depositions may be accomplished galvanostatically at rates of approximately 3-8 mA cm$^{-2}$ s$^{-1}$ for between approximately 40-180 seconds. The above stacked metal films may be sulfurized/selenized in a quartz tube furnace. The thin films and approximately 200-800 mg of the chalcogen (sometimes both) may be inserted into the furnace under flowing nitrogen. The furnace may be ramped to approximately 400-600° C. in approximately 20-120 minutes, held at temperature for approximately 20-40 minutes, and cooled slowly. In other embodiments, the furnace may be ramped to about 500-600° C. in approximately 20-120 minutes, held at temperature for about 20-30 minutes, and cooled slowly. The annealed samples may be built into devices. CdS may be deposited via a chemical bath 150, on top of which a bilayer comprising ZnO may be deposited via RF sputter 160, followed by an electron beam sputtering process of Ni/Al to form grids 170.

The annealed samples may be analyzed via X-ray diffraction (XRD). The ratio of Cu:Zn:Sn may be determined via ICP and X-ray fluorescence. The crystal structure of films with atomic ratios between 2.0:1.2:1.0 to 1.2:0.8:1.0 reveal some differences, namely copper-poor films have much stronger peaks, but also have peaks from other phases.

Figure 5:
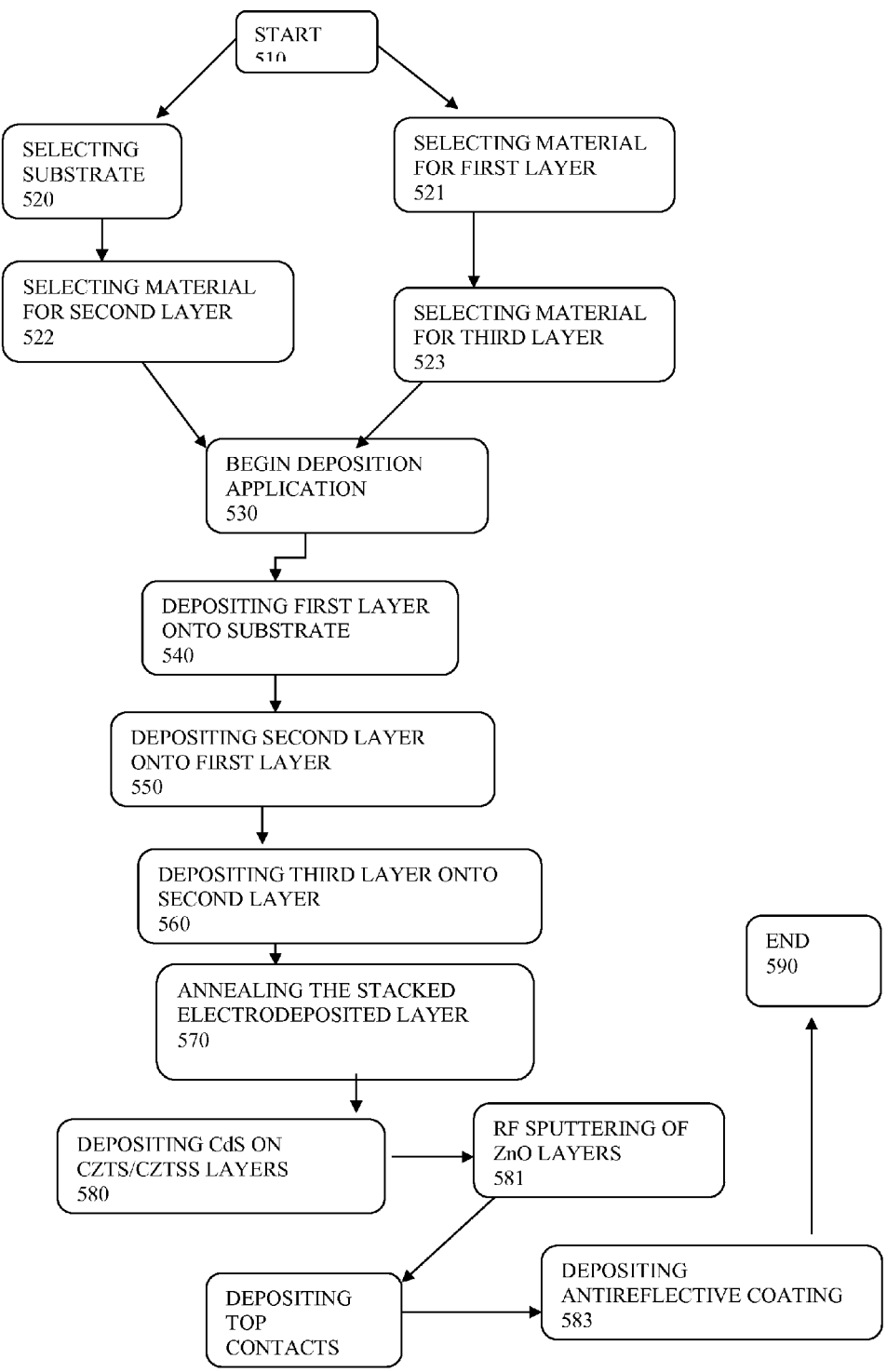
FIG. 5 is a flowchart of a method of forming chalcogen-based semiconductor thin films within an electrochemical device.

FIG. 5 illustrates one method 500 for fabricating an electrochemical device with a three-tiered thin film layers comprising copper, zinc, tin, sulfur and selenium described herein. The method 500 begins at 510 such as by designing of a particular device to be fabricated such as lithium-ion battery or the like. The method 500 continues with selecting material for the substrate 520, first layer 521, second layer 522, and third layer 523. At 530, the method 500 may include the deposition application of the three layers. The method 500 continues with depositing the first layer onto the substrate 540, followed by depositing the second layer onto the first layer 550 and depositing the third layer onto the second layer 560. The device is completed by annealing the stacked electrodeposited layers 570 in chalcogen, followed by depositing CdS 580, RF sputtering of ZnO layers 581, depositing top contacts 582 and depositing an antireflective coating 583. The method 500 then may end at 590.

Exemplary methods for electrodepositing thin films are provided in the examples, but any method suitable for moving metal ions in a solution by an electric field to coat an electrode may be used. An exemplary embodiment may involve films electrodeposited by potentiostatic methods.

Further provided are methods for producing a thin-film on a substrate comprising a metallic salt, a chalcogen and an ionic compound in a non-aqueous solution mixed with a solvent. In some embodiments, the ionic compound may comprise sodium sulfate, sodium fluoride, potassium fluoride, potassium bifluoride, sodium bifluoride, sodium chloride, zinc chloride, potassium chloride, or choline chloride ($C_5H_{14}ClNO$). In some embodiments, where the ionic compound comprises sulfonate, it may be mixed with a surfactant. The sulfonate may comprise mesylate, triflate, tosylate, or besylate.

EXAMPLES

The foregoing examples of the related art and limitations related therewith are intended to be illustrative and not exclusive. Other limitations of the related art will become apparent to those of skill in the art upon a reading of the specification and a study of the drawings.

Example #1

A first layer comprising copper may be electrodeposited on a molybdenum/chromium/glass substrate. Copper may be electrodeposited from an aqueous bath comprising CuSO$_4$ (100 mM) and Na$_2$SO$_4$ (100 mM). A second layer comprising tin may be electrodeposited from an aqueous bath comprising SnCl$_2$ (150 mM), SnCl$_4$ (5-10 mM), NaF (800 mM), NaCl (450 mM) and KF (550 mM); HCl may be used to acidify the bath to a pH of approximately 5. A third layer comprising zinc may be electrodeposited from an aqueous bath comprising ZnSO$_4$ (100 mM), ZnCl$_2$ (100 mM), and H$_3$BO$_3$ (215 mM).

Example #2

A first layer comprising copper may be electrodeposited on a molybdenum/chromium/glass substrate. Copper may be electrodeposited from an aqueous bath of CuSO$_4$ (100 mM) and Na$_2$SO$_4$ (100 mM). A second layer comprising tin may be electrodeposited from an ionic liquid (IL) solution comprising choline chloride-ethylene glycol (ChCl:EG). Approximately 626 g of ChCl and 500 mL of EG may be heated at approximately 90° C. to prepare the ionic liquid solution. A tin plating bath may be prepared by dissolving approximately 0.1 M $SnCl_2$ in ChCl:EG solvent. A third layer comprising zinc may be electrodeposited from an aqueous bath comprising $ZnSO_4$ (100 mM), $ZnCl_2$ (100 mM), and $H_3BO_3$ (215 mM).

Example #3

A first layer comprising copper may be electrodeposited on molybdenum/chromium/glass substrate. Copper may be electrodeposited from an aqueous bath of $CuSO_4$ (100 mM) and $Na_2SO_4$ (100 mM). A second layer comprising tin may be electrodeposited from an ionic liquid (IL) solution comprising choline chloride-ethylene glycol (ChCl:EG). About 626 g of ChCl and 500 mL of EG may be heated at about 90° C. to prepare the ionic liquid solution. A tin plating bath may be prepared by dissolving approximately 0.1 M $SnCl_2$ in ChCl:EG solvent. A third layer comprising zinc may be electrodeposited from an ionic liquid (IL) solution comprising choline chloride-ethylene glycol (ChCl:EG). About 626 g of ChCl and 500 mL of EG may be heated at about 90° C. to prepare the ionic liquid solution. A Zinc plating bath may be prepared by dissolving approximately 0.1 M $ZnCl_2$ in ChCl:EG solvent.

Example #4

A first layer comprising copper may be electrodeposited on a molybdenum/chromium/glass substrate. Copper may be electrodeposited from an aqueous bath comprising $CuSO_4$ (100 mM) and $Na_2SO_4$ (100 mM). A second layer comprising tin may be electrodeposited from a sufonate-based electrodeposition bath with surfactant (Empigen BB). Tin may be used as a counter electrode. The Faradic efficiency of anode reaction (i.e. Sn dissolution) is as high as cathodic reaction (both close to 100%). A third layer comprising zinc may be electrodeposited from an ionic liquid (IL) solution comprising choline chloride-ethylene glycol (ChCl:EG). About 626 g of ChCl and 500 mL of EG may be heated at about 90° C. to prepare the ionic liquid solution. Zinc plating bath is prepared by dissolving about 0.1 M $ZnCl_2$ in ChCl:EG solvent. Zn may be used as a counter electrode. The Faradic efficiency of anode reaction (i.e. Zn dissolution) is as high as cathodic reaction (both close to 100%).

Example #5

Thin film Cu—Zn—Sn—(Se,S) was prepared by annealing the stacked electrodeposited Cu/Sn/Zn layer in a tube furnace in the presence of elemental sulfur and selenium at about 550° C. First a Cu layer was electroplated on Mo/glass substrate from a solution containing 25 gm $CuSO_4.5H_2O$ and 14 gm $Na_2SO_4$ dissolved in 1000 ml water. The pH of the solution was adjusted to 1.65 by adding 2.6 ml $H_2SO_4$. Second Sn layer was deposited on Cu/Mo/glass from a solution containing 17.5 $SnCl_2.2H_2O$ dissolved in 500 ml ionic liquid solvent. Ionic liquid solvent was prepared by dissolving 313 gm choline chloride in 500 ml ethylene glycol. Third Zn layer was prepared from 90 gm $ZnSO_4.4H_2O$, 7.5 gm $ZnCl_2$, 6.2 gm $H_3BO_3$ and 5 ml Epigen BB dissolved in 500 ml water.

Photovoltaic devices were completed by chemical-bath deposition of about 50 nm CdS, followed by RF sputtering of 60 nm of intrinsic ZnO and 120 nm of $Al_2O_3$-doped conducting ZnO. Bilayer Ni (50 nm)/Al (3 µm) top contacts were deposited in an e-beam system. The final step in the fabrication sequence was the deposition of an antireflection coating (100 nm of $MgF_2$). The current-voltage (I-V) of the devices is shown in FIG. 2. The cell parameters are 0.54 V open-circuit voltage, 16.9 $mA/cm^2$ short-circuit current density, 40% fill factor, and 3.6% efficiency. The device efficiency before anti-reflection coating $MgF_2$ is 3.4% (open-circuit voltage: 0.53 V, short-circuit current density: 16.1 $mA/cm^2$, fill factor: 40%).

Example #6

Electrodeposition of Cu—Sn—Zn was performed sequentially from a Cu-plating solution, Sn-plating solution, and Zn-plating solution, respectively. First, a Cu layer was electrodeposited on a Mo/glass substrate from a Cu-plating solution, the second Sn layer was electrodeposited from a Sn-plating solution, and the third Zn layer was electrodeposited from a Zn-plating solution. The solution concentrations of each deposition solutions were 0.1 M. Fisher Scientific (FB300) and VWR (300V) power supplies were used to electrodeposit Cu—Sn—Zn thin films. All films were electrodeposited by applying constant current. Cu was plated at −4.2 $mA/cm^2$ for 3 minutes, Sn was plated at −2.0 $mA/cm^2$ for 22 minutes and Zn was plated at −1.7 $mA/cm^2$ for 4 minutes.

The desired film composition was obtained by adjusting the film thickness of Cu, Sn and Zn. The films were electrodeposited in a vertical cell in which the electrodes (both working and counter) were suspended vertically from the top of the cell. Precursor films were prepared by employing a two-electrode cell in which the counter electrode was Pt gauze and the working electrode (substrate) was glass/Mo. The Mo film was about 1 µm thick and was deposited by direct current (dc) sputtering. All chemicals were of Analar- or Puratronic-grade purity and were used as received. The film compositions were analyzed using Agilent Technologies 7700 Series ICP-MS system. X-ray diffraction (XRD) was performed by a Scintag X-ray machine using a Copper $K_{\alpha 1}$ radiation at $\lambda$=0.5456 Å. PV devices were completed by chemical-bath deposition of about 50 nm CdS, followed by radio frequency (RF) sputtering of 50 nm of intrinsic ZnO and 350 nm of $Al_2O_3$-doped conducting ZnO. Bilayer Ni/Al top contacts were deposited in an e-beam system.

The Examples discussed above are provided for purposes of illustration and are not intended to be limiting. Still other embodiments and modifications are also contemplated. While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

I claim:

1. A method for producing a semiconductor thin-film comprising:
   (a) electrodepositing, onto a substrate, from an aqueous bath into which a first metallic salt has been dissolved, a first layer comprising a first metal;
   (b) electrodepositing, onto the first layer, a second layer comprising a second metal;
   (c) electrodepositing, onto the second layer, from a non-aqueous ionic liquid into which a second metallic salt has been dissolved, a third layer comprising a third metal; and
   (d) annealing the first, second and third layers in chalcogen.

2. The method of claim 1, wherein the first metallic salt comprises at least one of stannous chloride ($SnCl_2$) or stannic chloride ($SnCl_4$).

3. The method of claim 1, wherein the chalcogen comprises at least one of selenium, sulfur, telluride, or polonium.

4. The method of claim 1, wherein the ionic liquid comprises at least one of sodium sulfate, sodium fluoride, potassium fluoride, potassium bifluoride, sodium bifluoride, sodium chloride, zinc chloride, or potassium chloride.

5. The method of claim 1, wherein the ionic liquid comprises choline chloride ($C_5H_{14}ClNO$).

6. The method of claim 5, wherein the ionic liquid further comprises ethylene glycol.

7. The method of claim 1, wherein the second layer is electrodeposited from a sulfonate-based solution into which a third metallic salt has been dissolved.

8. The method of claim 7, wherein the sulfonate-based solution comprises a surfactant.

9. The method of claim 7, wherein the sulfonate comprises at least one of a mesylate, a triflate, a tosylate, or a besylate.

10. The method of claim 1, wherein the first metal comprises copper.

11. The method of claim 1, wherein the second metal comprises tin.

12. The method of claim 1, wherein the third metal comprises zinc.

13. The method of claim 1, wherein at least one of electrodepositing the first layer, electrodepositing the second layer, and electrodepositing the third layer comprises using a plating current density in the range of approximately 1 to 8 $mA/cm^2$.

14. The method of claim 1, wherein the substrate comprises at least one of glass, chromium, molybdenum, silicon, silicon dioxide, aluminum oxide, sapphire, germanium, an alloy of silicon and germanium, or an alloy of indium phosphide (InP).

15. The method of claim 1, wherein the substrate comprises glass coated with a molybdenum film.

16. The method of claim 1, wherein the ionic liquid has a pH in the range of approximately 1-5.

17. The method of claim 1, wherein the second metallic salt comprises at least one of zinc sulfate or zinc chloride.

* * * * *